United States Patent
Dances

(10) Patent No.: US 6,778,198 B2
(45) Date of Patent: Aug. 17, 2004

(54) GLASS SUBSTRATE PRINTED WIRING BOARD PRINTHEAD FOR ELECTRIC PAPER

(75) Inventor: Robert J. Dances, Torrance, CA (US)

(73) Assignee: Xerox Corporation, Stamford, CT (US)

(*) Notice: Subject to any disclaimer, the term of this patent is extended or adjusted under 35 U.S.C. 154(b) by 297 days.

(21) Appl. No.: 10/050,182

(22) Filed: Jan. 18, 2002

(65) Prior Publication Data

US 2003/0137477 A1 Jul. 24, 2003

(51) Int. Cl.⁷ .................................................. B41J 2/40
(52) U.S. Cl. ..................................... 347/148; 347/141
(58) Field of Search ................................ 347/141, 148, 347/150, 151, 128

(56) References Cited

U.S. PATENT DOCUMENTS

| | | | | |
|---|---|---|---|---|
| 4,126,854 A | | 11/1978 | Sheridon | 340/373 |
| 4,415,403 A | * | 11/1983 | Bakewell | 216/27 |
| 5,274,401 A | * | 12/1993 | Doggett et al. | 347/148 |
| 5,576,742 A | * | 11/1996 | Abe | 346/150.1 |
| 6,222,513 B1 | | 4/2001 | Howard et al. | 345/84 |
| 6,478,413 B1 | * | 11/2002 | Motegi et al. | 347/76 |

* cited by examiner

*Primary Examiner*—Andrew H. Hirshfeld
*Assistant Examiner*—Leo T. Hinze
(74) *Attorney, Agent, or Firm*—Oliff & Berridge, PLC

(57) ABSTRACT

A glass substrate printed wiring board is used as the printhead for electric paper. Printing electrodes are formed at the edge of the glass substrate. Signals are generated by a driver circuit and conducted by traces to the electrodes to generate an electric field to rotate the bichromal rotating elements of the electric paper to form black or white pixels.

8 Claims, 3 Drawing Sheets

GLASS SUBSTRATE PRINTED WIRING BOARD PRINTHEAD FOR ELECTRIC PAPER

BACKGROUND OF THE INVENTION

The present invention relates to a printed wiring board (PWB) being used as a printhead and, more particularly, to a glass substrate printed wiring board printhead for electric paper.

Electric paper can be defined as any electronically addressable display medium that approximates paper in form and function. Electric paper should be light-weight, thin and flexible, and it should display images indefinitely while consuming little or no power. In addition, electric paper should be re-usable. One must be able to erase images and create new ones repeatedly. Preferably, electric paper should display images using only reflected light and allow a very wide-viewing angle.

One way to make electric paper possible using traditional electronic display technology is to completely remove the driving electronics from an electronic display package and use external addressing electrodes to write and erase images. This approach both reduces the per unit cost of electronic paper sheets and enables the use of cheap, flexible plastic films in place of glass plates for packaging. Multiple electronic paper sheets can then be addressed by a single set of external driving electronics, much like multiple sheets of pulp paper are printed on by a single printer.

This invention is designed for use with Gyricon electric paper but may also be used with electric paper based on liquid crystal, electrophoretic, and other field-effect display technologies.

The Gyricon sheet and display system is disclosed in various patents and articles, such as U.S. Pat. No. 4,126,854 by Sheridon titled "Twisting Ball Display", commonly assigned as the present application and herein incorporated by reference. The Gyricon display system is comprised of an elastomeric host layer a few mils thick which is heavily loaded with rotating elements, possibly spheres, tens of microns in diameter. Each bichromal rotating element has halves of contrasting colors, such as a white half and a black half, and forms a single picture element or pixel. Each bichromal rotating element also possesses an electric dipole, orthogonal to the plane that divides the two colored halves. Each bichromal rotating element is contained in its own cavity filled with a dielectric liquid. Upon application of an electric field between electrodes located on opposite surfaces of the host layer, the rotating elements will rotate depending on the polarity of the field, presenting either the white side or the black side to an observer.

Printing is accomplished by imposing an electrical pattern over the sheet, where there is a voltage difference between the top side and the bottom side. A typical way to do this is to pass the paper under a charging bar. As the paper passes under the bar, voltages are applied along a set of closely-spaced electrical contacts, one for each bichromal rotating element or pixel.

The response pattern of the bichromal rotating element to an external electrical field determines the types of addressing that may be used to create images on the Gyricon electric paper display. There are known in the art three types of addressing schemes for displays.

In active matrix addressing, a separate addressing electrode is provided for each bichromal rotating element or pixel of the display and each of these electrodes is continuously supplied with an addressing voltage. The complete set of voltages can be changed for each addressing frame. This type of addressing places the least demands on the properties of the display medium, however, active matrix addressing is the most expensive, most complicated and most energy consuming type of addressing.

The second type of addressing scheme is passive matrix addressing. Passive matrix addressing makes use of two sets of electrodes, one on each side of the display medium. Typically, one of these consists of horizontal conductive bars and the other consists of vertical conductive bars. The bars on the front surface or window of the display are necessarily transparent. To address the display medium, a voltage is placed on a horizontal conductive bar and a voltage is placed on a vertical conductive bar. The segment of medium located at the intersection of these two bars experiences a voltage equal to the sum of these two voltages.

Passive addressing is less complicated and more energy efficient because the pixels of the display medium are addressed only for as long as is required to change their optical states. However, the requirements for a medium that can be addressed with a passive matrix display are significantly greater than for the active matrix case. The medium must respond fully to the full addressing voltage but it must not respond to ½ the full addressing voltage. This is called a threshold response behavior. The medium must also stay in whichever optical state it has been switched into by the addressing electrodes without the continuous application of voltage, that is it should store the image without power. Passive addressing is the most widely used method of addressing displays and is the lowest cost.

The third type of addressing, and probably the most useful for electric paper applications, consists of a linear array of addressing electrodes in the form of a bar that can be moved over the surface of the display medium. Typically, the medium is placed over a grounding electrode and is protected from possible mechanical damage from the moving bar by placing a thin window between the bar and the electric paper. As the bar is moved over the display medium, it applies voltages to specific bichromal rotating elements or pixels of the medium for short periods of time and generates a full image each time the bar is scanned over the surface.

Print heads can be used as the third type of addressing electric paper with a linear bar array as taught in U.S. Pat. No. 6,222,513, commonly assigned as the present application and herein incorporated by reference.

Printed wiring boards have been used as the print heads in electrostatic printing for electrically addressing points across a dielectric medium.

A printed wiring board is a flat plate or base of insulating material containing a pattern of conducting material. The patterned conducting material forms traces which electrically connect electronic components on the surface of the printed wiring board to form circuits.

The conducting material is commonly copper which has been coated with solder or plated with tin or tin-lead alloy. The usual insulating material is epoxy laminate. But there are many other kinds of materials used in more exotic technologies. Printed wiring boards are also called printed circuit boards.

The patterned conducting material in addition to forming connective traces also forms pads, conductive areas on the surface of the printing wiring board. Pads are provided on the board so that connection can be made to the surface mounted components. The surface mounted components are any of the basic electronic parts used in forming a circuit such as resistors, capacitors, DIP, integrated circuits and the like.

Single layer printed wiring boards have all the conductors, the traces, pads and surface mounted components on one side of the board. For the purpose of functioning as print heads, printed wiring boards have all their components and conductors on a single side.

Conventional printed wiring boards are manufactured by joining an epoxy laminate and a copper laminate with heat and pressure. The epoxy laminate is much thicker than the copper laminate and it provides mechanical support for the printed wiring board. Application of heat and pressure causes the epoxy to soften and bond to the copper laminate. The copper surface is treated either chemically, or electrochemically with dendritic treatment, both of which produce a jagged surface on a microscopic scale, which promotes adhesion to the epoxy laminate.

Photo-resist is then applied on the copper surface. Liquid photo-resist application has recently been replaced by "dry" photo-resist methods. In the dry photo-resist technique, a photo-resist film is laminated on the copper, also by application of heat and pressure.

The conductor pattern for the traces and pads for the circuitry of the printed wiring board is then "exposed" on the photo-resist. The exposed board is "developed" in an appropriate chemical solution that dissolves the photo-resist, consequently exposing the copper surface along the areas which are to be etched.

In the copper etching operation, the developed board is passed through a chemical spray chamber, where jets spray chemicals which dissolve copper. The photo-resist and the copper etching solution have been chosen so that the sprayed chemicals only dissolve the copper and not the photo-resist. At the conclusion of the copper etching process, a well defined conductor pattern of traces and pads with a overlay of photo-resist is left on the epoxy substrate.

The photo-resist overlay is then etched away by another chemical solution which etches only the photo-resist and not the copper.

The necessary print head electric components are then mounted to the appropriate pre-determined points in the traces and pads on the copper conductor pattern on the surface of the printed wiring board. Electrodes extend over the edge of the printed wiring board to provide electric contacts for the print head.

There are problems with using a conventional printed wiring board as the print head for electric paper. Typical etch line width and spacing for the electrodes of a printed wiring board are 0.003 inches which does not provide a high enough density of spots per inch (spi) for electric paper. The printed wiring board is subject to a predictable amount of expansion, twist and warping during the manufacturing process. The printhead for electric paper must be structurally strong to avoid warping and thus inaccurate printing of spots during high spi printing. A printed wiring board used as a print head in an electrostatic printer uses extremely high voltages far exceeding the small voltages needed for the subtle changes to cause the bichromal rotating element or pixel to rotate black and white sides in the display sheet of the electric paper.

It is an object of this invention to provide a printed wiring board for use as a printhead for electric paper.

SUMMARY OF THE INVENTION

According to the present invention, a glass substrate printed wiring board is used as the printhead for electric paper. Printing electrodes are formed at the edge of the glass substrate. Signals are generated by a driver circuit and conducted by traces to the electrodes to generate an electric field to rotate the bichromal rotating elements of the electric paper to form black or white pixels.

The electrodes have a robust wear metallic layer deposited over the conductive traces. An isolation resistor is provided on each trace between the electrode and the driver circuit.

The pitch between the electrodes of the printhead matches the pitch of the bichromal rotating elements of the electric paper with each electrode having a single corresponding bichromal rotating element.

Other objects and attainments together with a fuller understanding of the invention will become apparent and appreciated by referring to the following description and claims taken in conjunction with the accompanying drawings.

DESCRIPTION OF THE INVENTION

Figure 1:
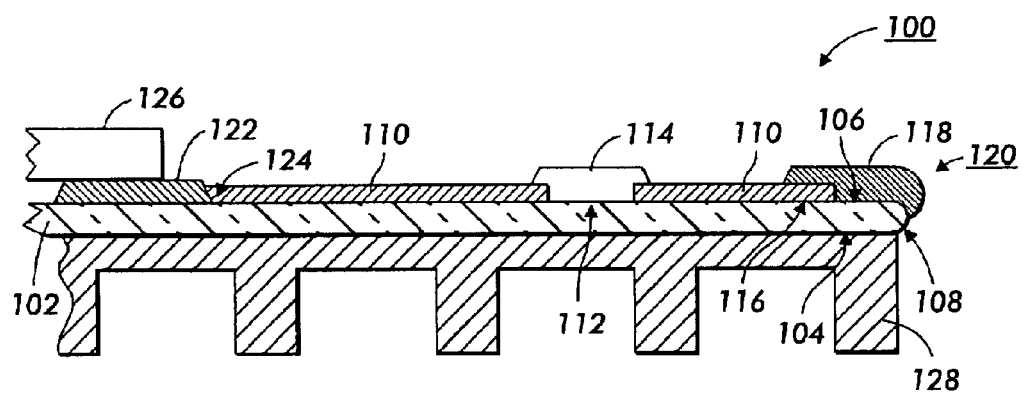
FIG. 1 is a side view of the glass substrate printed wiring board printhead for electric paper of the present invention.
Figure 2:
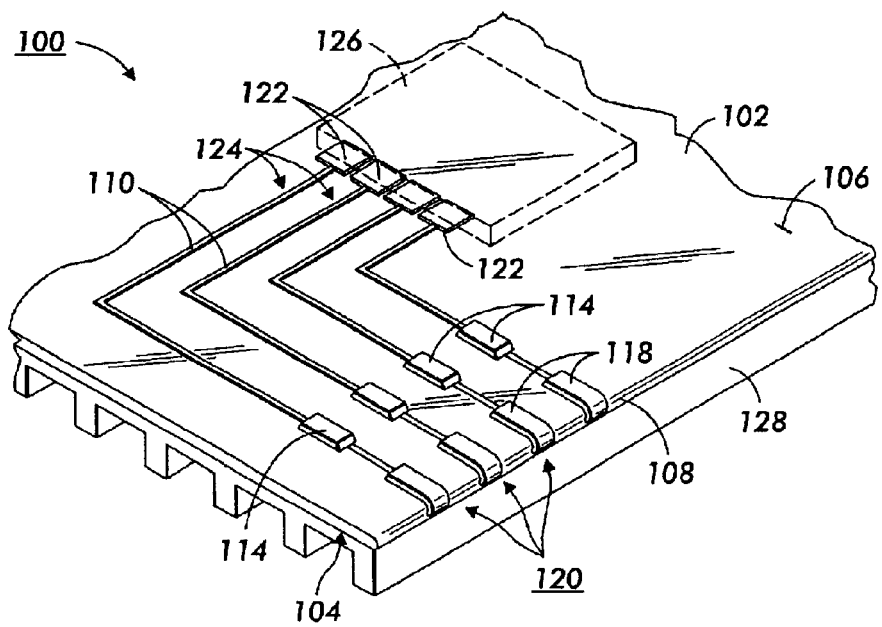
FIG. 2 is a perspective view of the glass substrate printed wiring board printhead for electric paper of FIG. 1.

Reference is now made to FIGS. 1 and 2, wherein there is illustrated the glass substrate printed wiring board printhead 100 for electric paper in accordance with this invention. The glass substrate of the printhead has a plurality of electrodes physically positioned along one edge of the printhead to electrically address the surface of the electric paper as the electric paper travels past the print head.

A glass substrate 102 of the printed wiring board print head 100 has substantially parallel planar surfaces 104 and 106. The glass substrate 102 has a thickness of between 0.01 and 0.05 inches, preferably 0.05 inches. The glass substrate 102 has close to zero coefficient of thermal expansion providing an electrically insulating, thermally stable and physically stable platform for the printhead 100.

A rounded edge 108 between the two surfaces 104 and 106 is the printhead leading edge which will be physically positioned adjacent to the electric paper 200. The edge 108 can be rounded by conventional means such as grinding and flame burnishing.

Electrically conductive traces 110 are formed on the upper surface 104 of the glass substrate 102. The traces 110 are of uniform width of 0.0001 inches and a uniform thickness of at least 0.000005 inches. The traces are preferably copper or, alternatively, any other appropriate conductive material such as nickel, gold, beryllium, chrome, molybdenum, or aluminum. The traces 110 are formed and patterned on the glass substrate 102 by well known methods such as vacuum metal deposition, photolithography or electro-printing or any other method that can form metallic traces of high quality on a glass substrate. A coating layer of gold flash (not shown) can be deposited over the traces to prevent oxidation.

A uniform gap 112 is left in each of the traces 110 during fabrication of the traces. In each trace gap, a thin isolation resistor 114 of nichrome is formed. The nichrome resistor 114 can be fabricated by the same means as the traces 110. The length, width and thickness of the nichrome resistor will be process dependent and determined by the resistance value needed for the present invention.

One end 116 of each trace 110 is near the rounded edge 108 on the upper surface 104 of the glass substrate 102. A metal layer 118 is formed on the end 116 of the trace 110. The metal layer 118 extends over the upper surface 104 of the glass substrate 102 and partially onto the rounded edge 108 of the glass substrate 102. The metal layer 118 can be rhodium/platinum or pallidum. The metal layer 118 is formed by vacuum metal deposition or by the same means as the traces 110. The metal is patterned by conventional lithography techniques. The metal layer 118 will have a uniform width of 0.0002 inches, a length of 3 mils and at least 0.00005 inches thickness.

The end 116 of the trace 110 and the metal layer 118 form the printing electrode 120 of the printhead 100 of the present invention. The metal layer 118 also provides a robust wear surface for the electrode 120. The end 116 of the trace 110 has its usual thickness with the added thickess of the metal layer 118 on top to form the electrode 120.

Each of the linear electrodes 120 are parallel over all or a substantial portion of their length. The electrodes 120 may have a width of about 0.0002 inches and a thickness of 0.00005 inches. The electrodes are separated by a distance or pitch of about 0.0005 inches (i.e., the electrodes have a center to center distance of about 0.0007 inches) for a resulting 4000 spi. The pitch and width of the electrodes will vary depending upon the desired spi for the electric paper.

The traces in the figures are shown to be parallel. The traces need not be parallel for the purposes of this invention. Only the electrodes need be parallel for the invention.

Conductive bonding pads 122 are then formed at the interior end 124 of the traces 110 which is the trace end away from the electrode 120. The bonding pad 122 is typically gold or, alternatively, any other appropriate conductive material such as nickel, copper, beryllium, chrome, molybdenum, or aluminum. The bonding pad 122 is formed by vacuum metal deposition or by the same means as the traces 110. The bonding pad 122 has a width and length of 5 mils square. The bonding pad 122 has a width and length larger than the width of the trace 110.

An ASIC chip 126 is bonded to the conductive bonding pads 122 to drive the electrodes 120 of the printhead 100. For each electrode 120, a corresponding bonding pad 122 is provided. The bonding pads can be staggered to match the pin position on the driver chip 126 (the pins are not shown in these Figures) and to provide maximum packing density with maximum nearest neighbor distance. Alternately, a single bonding pad and trace for each pin position of the driver chip 126 can be connected to a multiplexer which sends signals along multiple traces to multiple electrodes.

An aluminum mount 128 is attached to the lower surface 106 of the glass substrate 102 to support and to protect the printhead 100.

Figure 3:
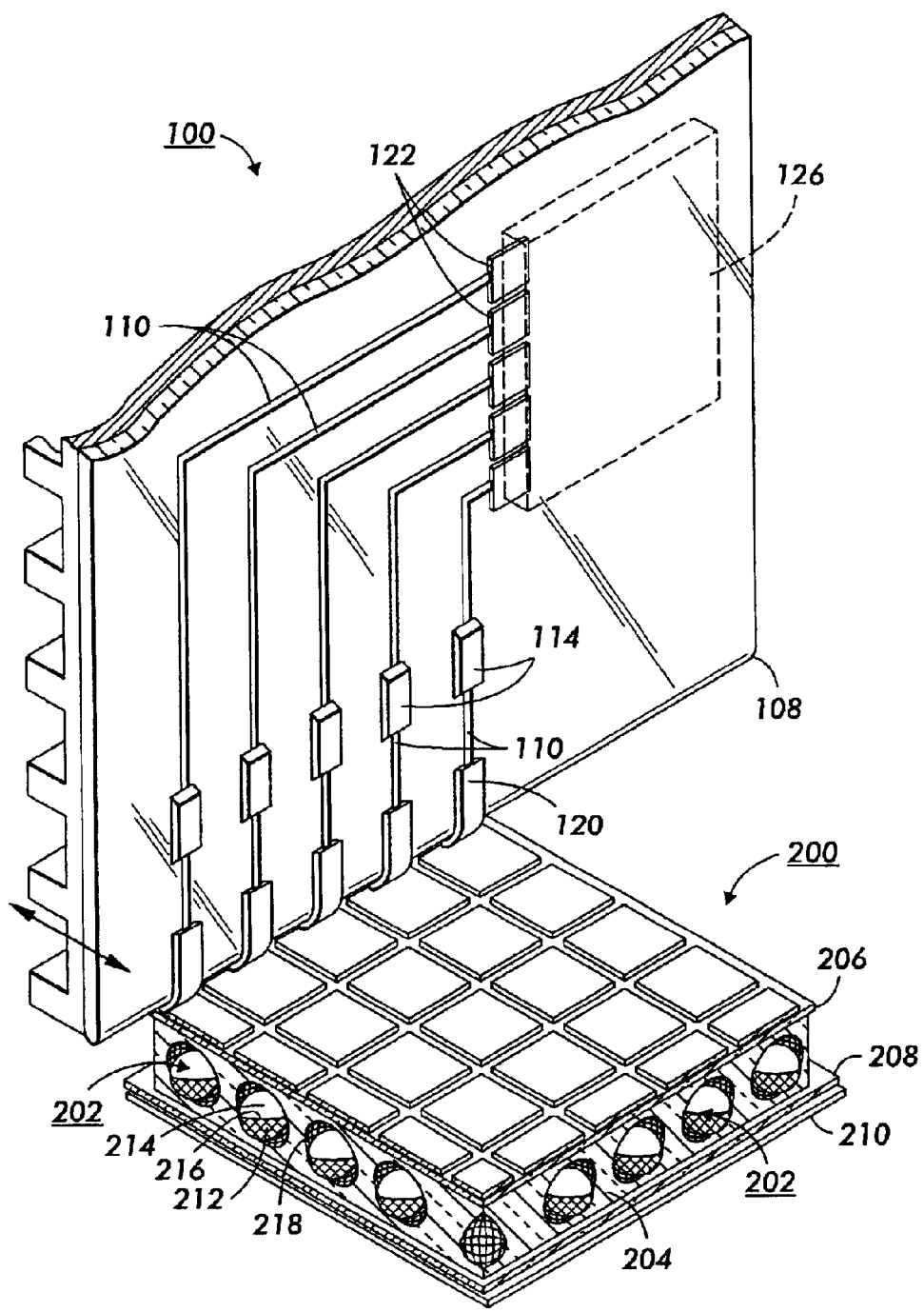
FIG. 3 is a perspective view of the glass substrate printed wiring board printhead writing on electric paper of the present invention.
Figure 4:
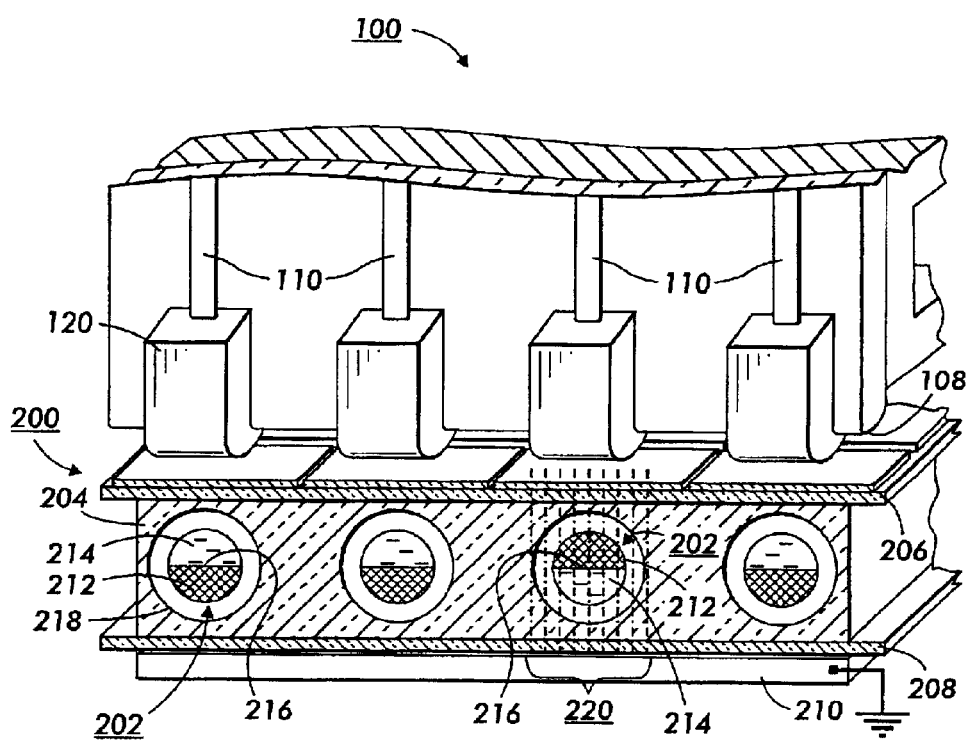
FIG. 4 is a side view of the glass substrate printed wiring board printhead writing on electric paper of FIG. 3.

As seen in FIGS. 3 and 4, a Gyricon electric paper sheet 200 has a plurality of bichromal rotating elements 202, in this case spheres tens of microns in diameter, cast in a retaining medium 204. The bichromal rotating elements 202 and the retaining medium 204 are contained between a first encapsulating layer 206 and a second encapsulating layer 208. The sheet 200 and encapsulating layers 206, 208 are placed in proximity to a supporting back plane 210 that is electrically grounded.

The bichromal rotating elements 202 have a black half 212 and a white half 214 and form a single picture element or pixel. Each bichromal rotating element 202 also possesses an electric dipole 216, orthogonal to the plane that divides the two colored halves. Each bichromal rotating element 216 is contained in its own cavity 218 in the retaining medium 204 filled with a dielectric liquid (not shown).

The driver chip 126 of the printhead 100 sends an electrical signal through the bonding pad 122 along the trace 110 through the isolation resistor 114 through the trace 110 to the electrode 120.

The electrode 120 at the leading edge 108 is physically positioned adjacent to the electric paper 200. The electrical signal generates an electrical field 220 between the electrode 120 and the electrically conductive ground plane 210 disposed on the opposite side of the electric paper sheet 200. The electric field 220 effects the electric dipole 216 of the bichromal rotating element 202 which causes the bichromal rotating element 202 to rotate, depending on the polarity of the field, presenting either the white side 214 or the black side 212 to an observer.

The electric field 220 between the single electrode 120 and the common ground plane 210 only effects the corresponding bichromal rotating element 202. The electric field 220 does not effect adjacent bichromal rotating elements.

When the image to be formed on the electric paper 200 is considered to be structured as a two-dimensional array of rows and columns of image pixels, the latent image is typically formed row by row (or column by column), requiring the printhead 100 to contain a writing electrode 120, for each pixel 200 or bichromal rotating element to be formed in a row (or column) of the image.

The pitch of the printhead is exactly the same as the desired resolution of the image to be produced; image resolution is described in terms of spots, or dots, per inch of the electric paper medium. Each electrode 120 produces an electric field 220 for its corresponding bichromal rotating element or pixel 202 as the electric paper 200 passes in close proximity to the printhead 100.

The printhead is generally arranged to print across the width of an entire electric paper sheet at a time, so that for a 600 spot per inch electric paper, the printhead will have approximately 5300 elements to print across an 8.5 inch wide electric paper sheet. The electrodes 120 can separated by a distance or pitch of about 0.0005 inches and have a center to center distance of about 0.0007 inches for a 4000 spi.

Thus, the printhead must be as wide as the visible image desired, which is typically related to the width of the electric paper, and the electrodes must be as closely spaced as necessary to form a visible image having the desired resolution. The closely spaced electrodes, however, are independently electrically controlled, requiring a suitable electrical connection trace from each electrode to circuitry that controls the formation of the image.

The glass substrate 102 provides high electrical resistance to the closely spaced electrodes 116 to prevent electrical cross-talk of electrical signals between electrodes. The nichrome isolators 114 prevent a short along the circuit from the electrode to the driver chip caused by dust or static build up at the electrode from the electric paper.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A printed wiring board printhead for forming an image on electric paper comprising a glass substrate having a first planar surface and a second planar surface, said first planar surface and said second planar surface being substantially parallel, said glass substrate having an edge between said first planar surface and said second planar surface;

a plurality of conductive traces formed on said first planar surface of said glass substrate;

a plurality of conductive bonding pads formed on said first planar surface of said glass substrate;

a plurality of metal layers formed on ends of the plurality of conductive traces, said plurality of metal layers extending over said first planar surface of said glass substrate and partially onto said edge of said glass substrate;

a plurality of electrodes formed where an end of said plurality of conductive traces and said plurality of metal layers are formed on said first planar surface of said glass substrate, said plurality of conductive traces connecting said a plurality of conductive bonding pads to said plurality of electrodes, said plurality of electrodes being substantially parallel and equally spaced apart; and a driver connected to said plurality of conductive bonding pads to send an electrical signal to each of said plurality of electrodes, said electrical signal generating an electric field between said electrode and said electric paper for controlling the corresponding individual pixel of said electric paper to form said image.

2. The printed wiring board printhead for forming an image on electric paper of claim 1, each of said plurality of electrodes using said electric field generated between at least one of said plurality of electrodes and said electric paper to drive a corresponding rotatable element on the electric paper.

3. The printed wiring board printhead for forming an image on electric paper of claim 1 wherein said driver is an integrated chip bonded to said plurality of conductive bonding pads.

4. The printed wiring board printhead for forming an image on electric paper of claim 1 wherein said plurality of conductive traces being formed of a first metal, and a plurality of electrode layers formed on said first planar surface of said glass substrate over said plurality of conductive traces and partially on said edge of said glass substrate, said plurality of electrode layers being formed of a second metal.

5. The printed wiring board printhead for forming an image on electric paper of claim 4 wherein said first metal of said plurality of conductive traces is copper.

6. The printed wiring board printhead for forming an image on electric paper of claim 5 wherein said second metal of said plurality of electrode layers is rhodium/platinum.

7. The printed wiring board printhead for forming an image on electric paper of claim 1 further comprising an isolation resistor formed on each of said plurality of conductive traces.

8. The printed wiring board printhead for forming an image on electric paper of claim 1 further comprising a mount attached to said second planar surface of said glass substrate.

* * * * *